United States Patent
Lai et al.

(10) Patent No.: US 10,332,835 B2
(45) Date of Patent: Jun. 25, 2019

(54) MEMORY DEVICE AND METHOD FOR FABRICATING THE SAME

(71) Applicant: MACRONIX INTERNATIONAL CO., LTD., Hsinchu (TW)

(72) Inventors: Erh-Kun Lai, Taichung (TW); Hsiang-Lan Lung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/806,551

(22) Filed: Nov. 8, 2017

(65) Prior Publication Data
US 2019/0139885 A1 May 9, 2019

(51) Int. Cl.
| | |
|---|---|
| *H01L 23/528* | (2006.01) |
| *H01L 27/11568* | (2017.01) |
| *H01L 27/11582* | (2017.01) |
| *H01L 21/28* | (2006.01) |
| *H01L 21/768* | (2006.01) |
| *H01L 21/02* | (2006.01) |
| *H01L 23/522* | (2006.01) |

(52) U.S. Cl.
CPC ...... *H01L 23/528* (2013.01); *H01L 21/02233* (2013.01); *H01L 21/28282* (2013.01); *H01L 21/76816* (2013.01); *H01L 21/76877* (2013.01); *H01L 23/5226* (2013.01); *H01L 27/11568* (2013.01); *H01L 27/11582* (2013.01)

(58) Field of Classification Search
CPC ......... H01L 27/11582; H01L 21/28282; H01L 27/1157; H01L 27/11578; H01L 29/7926
See application file for complete search history.

(56) References Cited

U.S. PATENT DOCUMENTS

| | | | |
|---|---|---|---|
| 6,933,556 B2 * | 8/2005 | Endoh | H01L 27/115 257/314 |
| 9,362,302 B1 * | 6/2016 | Lai | H01L 27/11582 |
| 9,431,417 B1 * | 8/2016 | Lai | H01L 27/1157 |
| 9,484,353 B1 * | 11/2016 | Lai | H01L 27/11556 |
| 9,627,397 B2 | 4/2017 | Lai et al. | |

(Continued)

OTHER PUBLICATIONS

TIPO Office Action dated Jul. 27, 2018 in Taiwan application (No. 106142087).

*Primary Examiner* — Jaehwan Oh

(74) *Attorney, Agent, or Firm* — McClure, Qualey & Rodack, LLP

(57) ABSTRACT

A memory device includes a semiconductor substrate, a bottom insulating layer disposed on the semiconductor substrate, a first conductive layer which is a selective epitaxial growth layer disposed on the bottom insulating layer; a plurality insulating layers disposed over the bottom insulating layer; a plurality of second conductive layers alternatively stacked the insulating layers and insulated from the first conductive layer; a contact plug passing through the bottom insulating layer and electrically contacting the semiconductor substrate with the first conductive layer; a channel layer disposed on at least one sidewall of at least one first through opening and electrically contact the contact plug, wherein the first through opening passes through the insulating layers, the second conductive layers, so as to expose the contact plug; and a memory layer disposed between the channel layer and the second conductive layers.

8 Claims, 8 Drawing Sheets

(56) References Cited

U.S. PATENT DOCUMENTS

| | | | |
|---|---|---|---|
| 2009/0108333 A1* | 4/2009 | Kito | H01L 27/115 257/324 |
| 2015/0221665 A1* | 8/2015 | Yasuda | H01L 27/11565 257/324 |
| 2017/0025428 A1 | 1/2017 | Lai et al. | |
| 2017/0200736 A1* | 7/2017 | Park | H01L 21/76879 |
| 2017/0287930 A1* | 10/2017 | Lee | H01L 27/11582 |
| 2018/0019257 A1* | 1/2018 | Son | H01L 23/5283 |
| 2018/0097009 A1* | 4/2018 | Zhang | H01L 27/11582 |

\* cited by examiner

MEMORY DEVICE AND METHOD FOR FABRICATING THE SAME

BACKGROUND

Technical Field

The disclosure of the present invention generally relates to a non-volatile memory (NVM) device and the method for fabricating the same, and more particularly to a vertical channel memory and the method for fabricating the same.

Description of the Related Art

An NVM device which is able to continually store information even when the supply of electricity is removed from the device containing the NVM cell has been widely adopted by bulk solid state memory applications in the art.

The method for fabricating an NVM device having a vertical channel, such as a vertical channel NAND flash memory device, generally includes steps as follows: A multilayers stack configured by a plurality of insulating layers and a plurality of poly-silicon layers alternatively stacked with each other is firstly provided on a semiconductor substrate. At least one through hole or trench is then formed in the multilayers stack, and a memory layer with silicon-oxide-nitride-oxide-silicon (SONOS), bandgap engineered SONOS (BE-SONOS), or charge trapping memories structure and a poly-silicon channel layer are formed in sequence on the side al s of the through hole/trench, whereby a plurality of memory cells are defined at the intersection points formed by the memory layer, the channel layer and the poly-silicon layers; and the memory cells are electrically connected to the semiconductor substrate that can serve as a bottom common source line for performing a block erase operation of the NVM device through the channel layer.

However, since the traditional bottom common source line is typically a doped region with rather high resistance formed in the semiconductor substrate, and parasitic junction may occur between the doping region and the semiconductor substrate, thus the power consumption may be increased, and the program/read operation reliability and device speed may be deteriorated by signal interference and RC delay due to the parasitic junction capacitance.

Therefore, there is a need of providing a memory device and the method for fabricating the same to obviate the drawbacks encountered from the prior art.

SUMMARY

One aspect of the present invention is to provide a memory device, wherein the memory device includes a semiconductor substrate, a bottom insulating layer disposed on the semiconductor substrate, a first conductive layer which is a selective epitaxial growth layer disposed on the bottom insulating layer; a plurality insulating layers disposed over the bottom insulating layer; a plurality of second conductive layers alternatively stacked the insulating layers and insulated from the first conductive layer; a contact plug passing through the bottom insulating layer and electrically contacting the semiconductor substrate with the first conductive layer; a channel layer disposed on at least one sidewall of at least one first through opening and electrically contact the contact plug, wherein the first through opening passes through the insulating layers, the second conductive layers, so as to expose the contact plug; and a memory layer disposed between the channel layer and the second conductive layers.

In accordance with another aspect of the present invention, a method for fabricating a memory device is provided, wherein the method includes steps as follows. A multilayers stack having a plurality of insulating layers and a plurality of sacrificing layers stacked with each other is provided on a semiconductor substrate. At least one first through opening passes through the multilayers stack to partially expose the semiconductor substrate, the insulating layers and the sacrificing layers. A selective deposition is performed to form a contact plug at the bottom of the first through opening, so as to make the contact plug electrically contacting the semiconductor substrate. A memory layer and a channel layer are formed in sequence on at least one sidewall of the first through opening to make the memory layer disposed between the channel layer and the sacrificing layers and make the channel layer electrically in contact with the contact plug. At least one second through opening is formed to pass through the multilayers stack to partially expose the semiconductor substrate, the insulating layers and the sacrificing layers. All of the sacrificing layers are removed through the second through opening. A first conductive layer and a plurality of second conductive layers are formed on positions where the sacrificing layers initially occupied, wherein the second conductive layers are above the first conductive layer, and the first conductive layer contacts the contact plug.

In accordance with the aforementioned embodiments of the present invention, a memory device and method for fabricating the same are provided, wherein a multilayers stack having a plurality of memory cells defined therein are formed on a semiconductor substrate; at least one contact plug passing through a bottom insulating layer and a first conductive layer in the multilayers stack is formed to electrically contact the semiconductor substrate with the first conductive layer; and a plurality of channel layers vertically passing through the multilayers stack and electrically in contact with the corresponding contact plugs are then provided to electrically connect the memory cells to form a plurality of memory cell strings. Wherein the distance between the conductive layer and the channel layer is substantially shorter than the distance between the semiconductor substrate and the channel layer.

Because the memory device provided by the embodiments of the present invention applies the independent conductive layer to serve as the bottom common source line, instead of using the semiconductor substrate to serve as the bottom common source line, as the prior art memory device does. The current path for performing the read/program operation of the present memory device passing through the conductive layer is shorter than that of the prior art memory device passing through the semiconductor substrate, the operation resistance of the present memory device can be thus significantly reduced. In addition, since there is no doped region with different conductivities formed in the conductive layer of the present memory device, thus the problems of signal interference due to the parasitic junction capacitance formed in the bottom common source line and substrate can be avoided, and the operation reliability and device speed of the memory device can be improved.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION

Figure 1:
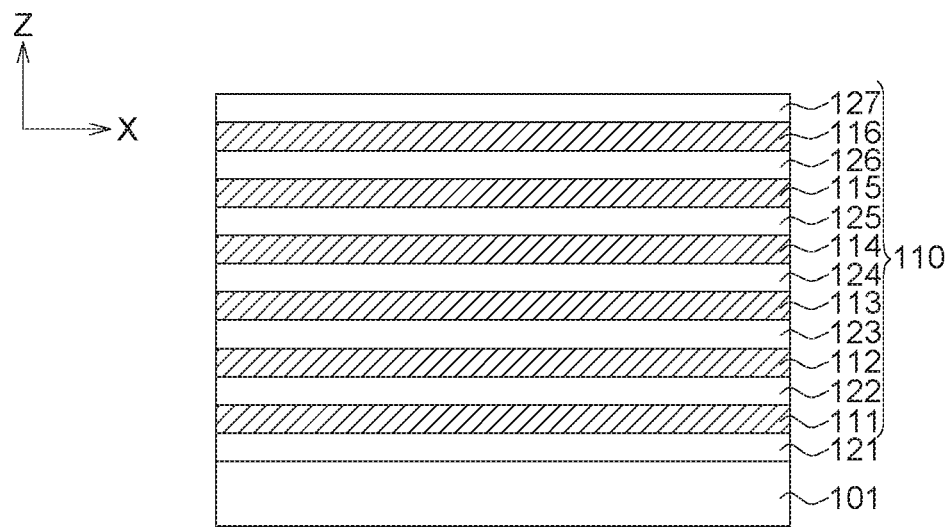
FIGS. 1 to 14 are cross-sectional views illustrating the processing structures for forming a memory device in accordance with one embodiment of the present invention.

The embodiments as illustrated below provide a memory device and the method for fabricating the same to solve the problems of operation reliability due to the signal interference of the parasitic junction capacitance formed in the bottom common source line and bottom substrate. The present invention will now be described more specifically with reference to the following embodiments illustrating the structure and method for fabricating the memory device.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily drawn to scale, and the identical elements of the embodiments are designated with the same reference numerals.

FIGS. 1 to 14 are cross-sectional views illustrating the processing structures for forming a memory device 100 in accordance with one embodiment of the present invention. In the present embodiment, the memory device 100 is a vertical channel flash memory device. The method for fabricating the memory device 100 includes steps as follows:

Firstly, a multilayers stack 110 is provided on a semiconductor substrate 101 (see FIG. 1). In some embodiments of the present invention, the semiconductor substrate 101 may be made of a p-type doped, n-type doped or undoped semiconductor material, such as poly-silicon, germanium (Ge) or any other suitable semiconductor material. In the present embodiment, the semiconductor substrate 101 is made of p-type doped poly-silicon.

The multilayers stack 110 includes a plurality of insulating layers 121-127 and a plurality of sacrificing layers 111-116 formed on the semiconductor substrate 101. The insulating layers 121-127 and the sacrificing layers 111-116 are parallel to each other and alternatively stacked on the semiconductor substrate 101 along the Z axle as shown in FIG. 1. In the present embodiment, the bottom insulating layer 121 and the insulating layer 127 respectively serve as the bottommost layer and the top-most layer of the multilayers stack 110, wherein the bottom insulating layer 121 is directly in contact with the semiconductor substrate 101 and electrically isolates the semiconductor substrate 101 from the sacrificing layers 111-116. In some embodiments of the present invention, the insulating layer 122 may have a thickness greater than that of the bottom insulating layers 121 and insulating layers 123-127. The bottom insulating layer 121 may have a thickness smaller than or similar to that of the insulating layers 123-127. In the present embodiment, the thickness of the insulating layer 122 may range from 100 Å (Angstrom) to 1500 Å, and preferably is 200-400 Å. The thickness of the bottom insulating layer 121 may range from 100 Å to 1200 Å, and preferably is about 100-400 Å. The bottom insulating layer 121 might have a thickness equal to or smaller than that of the insulating layers 123-127. The insulating layers 123-127 have the same thickness. The insulating layer 122 has a thickness larger than that of the insulating layers 123-127, such as twice or three times larger.

The sacrificing layers 111-116 may be made of silicon-nitride compounds, such as silicon nitride (SiN), silicon oxynitride (SiON), silicon carbonitride (SiCN), or the arbitrary combinations thereof. In the present embodiment, the sacrificing layers 111-116 are made of SiN. The insulating layers 121-127 may be made of dielectric material, such as silicon oxide, SiN, SiON, silicate or the arbitrary combinations thereof. However, it should be appreciated that, in the embodiments of the present invention, the sacrificing layers 111-116 and the insulating layers 121-127 are made of different material. In the present embodiment, the insulating layers 121-127 are made of silicon oxide. In some embodiments of the present invention, the sacrificing layers 111-116 and the insulating layers 121-127 can be formed by low pressure chemical vapor deposition (LPCVD).

Figure 2:
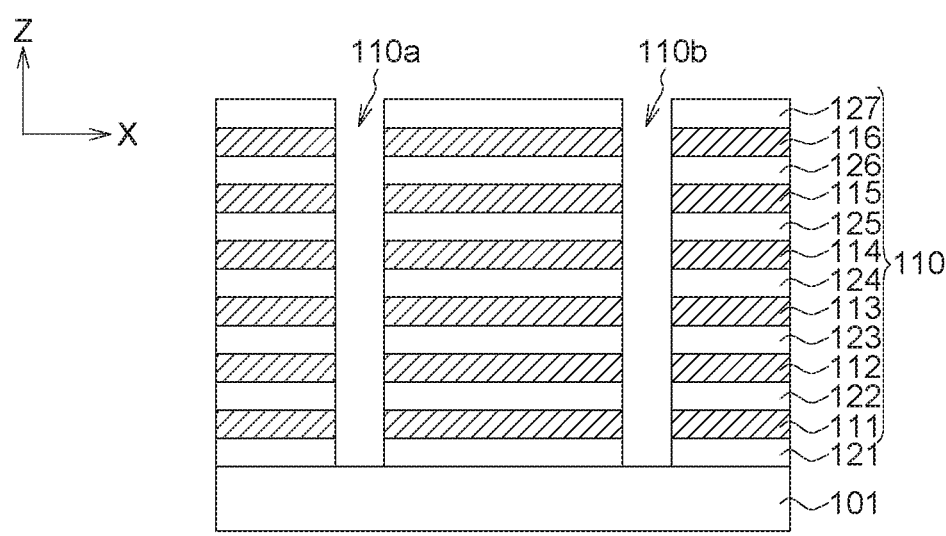

Next, an etching process is performed to form a plurality of first through openings 110a and 110b passing through the multilayers stack 110, so as to expose a portion of the semiconductor substrate 101 (see FIG. 2). In some embodiments of the present invention, the etching process for forming the first through openings 110a and 110b can be an anisotropic etching process, such as a reactive ion etching (RIE) process, performed on the multilayers stack 110 using a patterned hard mask layer as an etching mask. The first through openings 110a and 110b may be a plurality of circular through holes passing through the multilayers stack 110 along the Z axle used to expose a portion of the semiconductor substrate 101 serving as the bottom of the through openings 110a and 110b and used to expose portions of the sacrificing layers 111-116, the insulating layers 121-127 serving as the sidewalls of the first through openings 110a and 110b.

Figure 3:
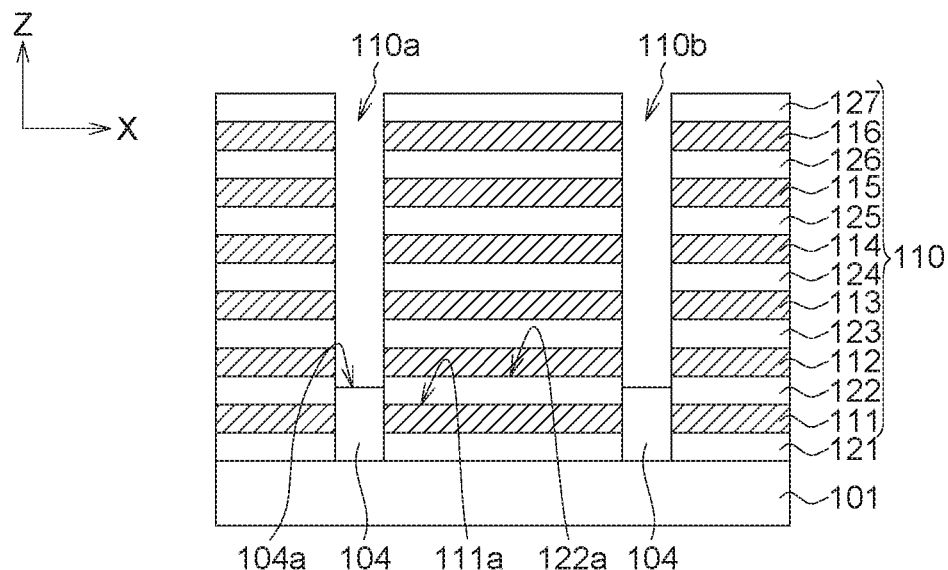

A selective deposition process is then performed to form a plurality of contact plugs 104 respectively disposed on one bottom of the first through openings 110a and 110b (see FIG. 3). In some embodiments of the present invention, the contact plugs 104 can be a monocrystalline silicon layer or a poly-silicon layer formed by a selective epitaxial growth (SEG) process. It could be undoped or lightly P-type doped SEG layer.

In order to eliminate the voids formed in the contact plugs 104, the contact plugs 104 may be subjected to an anneal process. In the present embodiment, the contact plugs 104, measured from the bottom surface of the semiconductor substrate 101, may be higher than the sacrificing layer 111 and lower than the sacrificing layers 112-116. In detail, in the present embodiment, the contact plugs 104 may have a top surface 104a substantially higher than the top surface 111a of the sacrificing layer 111 and lower than the top surface 122a of the insulating layer 122. However, it should be appreciated that the arrangements of the contact plugs 104, the insulating layer 122 and the sacrificing layers 111-116 are not limited in this respect.

Figure 4:
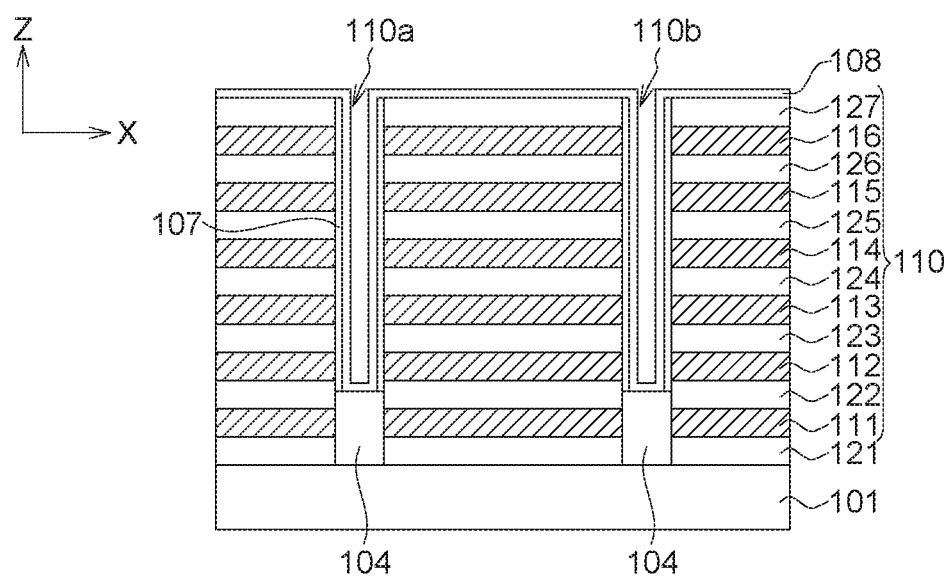
Figure 5:
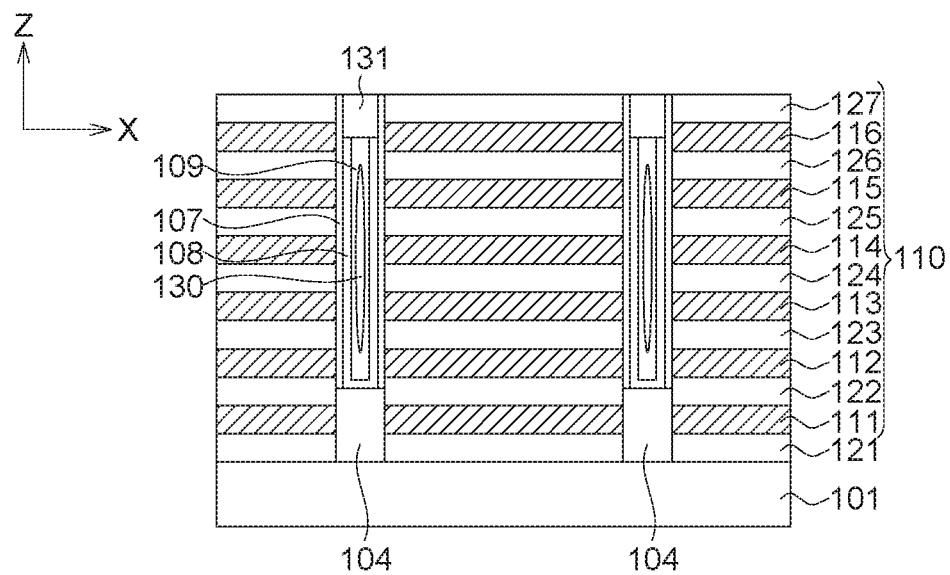

Next, a memory layer 107 and a channel layer 108 are formed in sequence on sidewalls of the first through openings 110a and 110b to make the memory layer 107 disposed between the channel layer 108 and the remaining sacrificing layers 112-116 and make the channel layer 108 electrically in contact with the top surface 104a of the contact plugs 104 (see FIG. 4). In some embodiments of the present invention, the forming of the memory layer 107 includes steps as follows: a composite layer having (but not limited to)

oxide-nitride-oxide (ONO), oxide-nitride-oxide-nitride-oxide(ONONO) or oxide-nitride-oxide-nitride-oxide-nitride-oxide (ONONONO) structure is firstly formed to conformally blanket over the multilayers stack 110, the sidewalls and the bottoms of the first through openings 110a and 110b. An etching process is then performed to remove portions of the composite layer having ONO, ONONO or ONONONO structure disposed on the top surface of the multilayers stack 110 and the bottoms of the first through openings 110a and 110b, so as to expose portions of the top surfaces 104a of the contact plugs 104.

In the present embodiment, a deposition process is performed to form a first layer of the channel layer 108 which is formed to blanket over the memory layer 107. An etching process is then performed to remove portions of the memory layer 107 disposed on the top surface of the multilayers stack 110 and the bottoms of the first through openings 110a and 110b and to remove portions of the first layer of the channel layer 108, so as to expose portions of the top surface 104a of the contact plugs 104. After that, a deposition process is performed to form a second layer of the channel layer 108 to cover the memory layer 107, the first layer of the channel layer 108 and the exposed portions of the top surface 104a of the contact plugs 104, so as to form the channel layer 108 connecting the first and second layers.

The channel layer 108 can be made of semiconductor material, such as silicon (Si), Ge or other doped/undoped semiconductor material. In the present embodiment, the channel layer 108 is made of undoped poly-silicon.

After the forming of the channel layer 108, the first through openings 110a and 110b are filled by a dielectric material 109, such as silicon dioxide ($SiO_2$), and at least one air gap 130 is formed in the filled first through openings 110a and 110b. After the dielectric material 109 is etched back, a bond pad 131 (N+ polyslicon or N+ poly/Salicide) may be formed on the dielectric material 109 to form an electrical contact with the channel layer 108 (see FIG.

Figure 6:
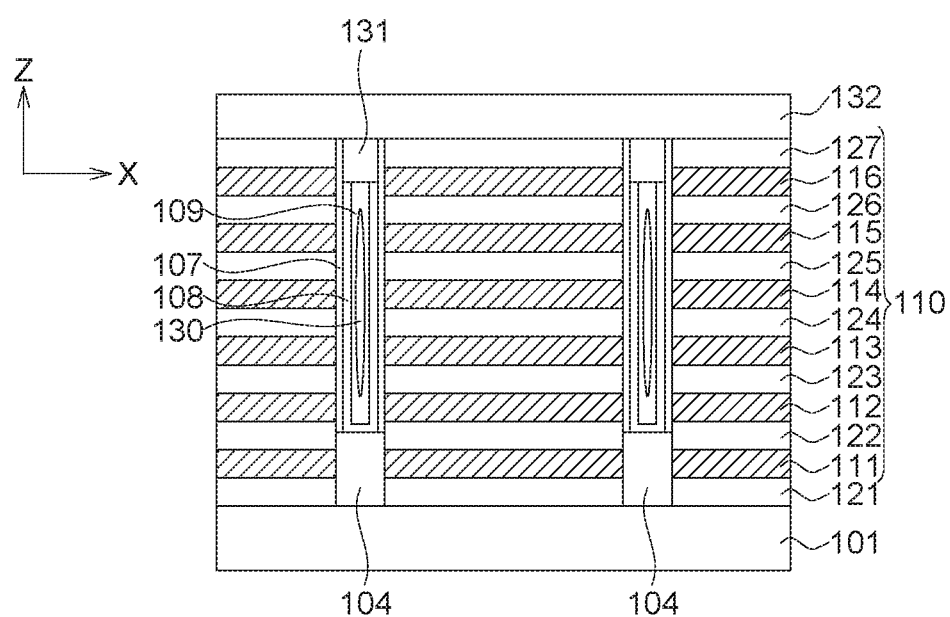

A capping layer 132 is then provided to cover the bond pad 131 and the multilayers stack 110 (see FIG. 6). In the present embodiment, the capping layer 132 includes silicon oxide.

Figure 7:
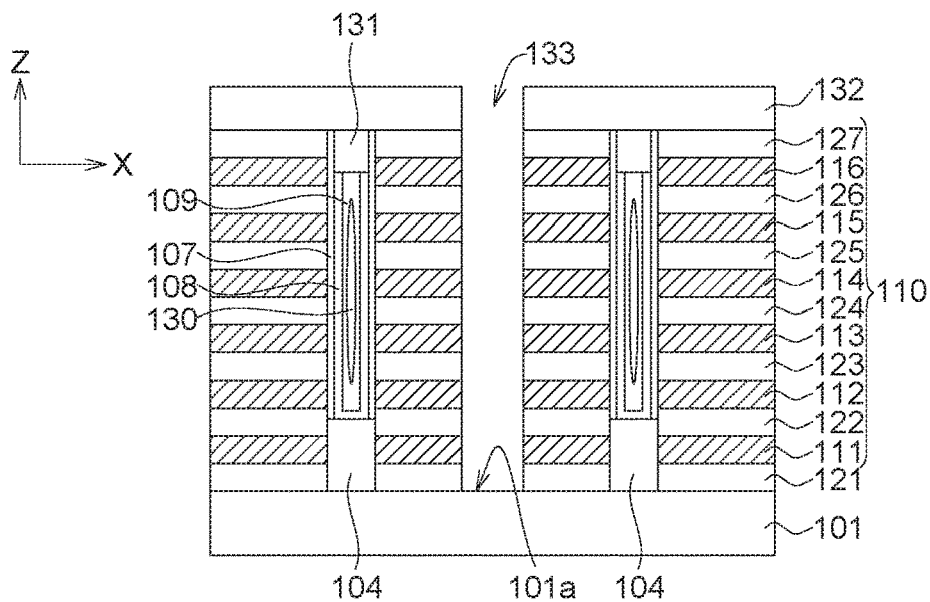

Subsequently, another etching process is performed to form at least one second through opening 133 passing through the multilayers stack 110 along the Z axle from the top surface of the multilayers stack 110, so as to partially expose the sacrificing layers 111-116, the insulating layers 121-127 and an exposed surface 101a of the semiconductor substrate 101 (see FIG. 7).

Figure 8:
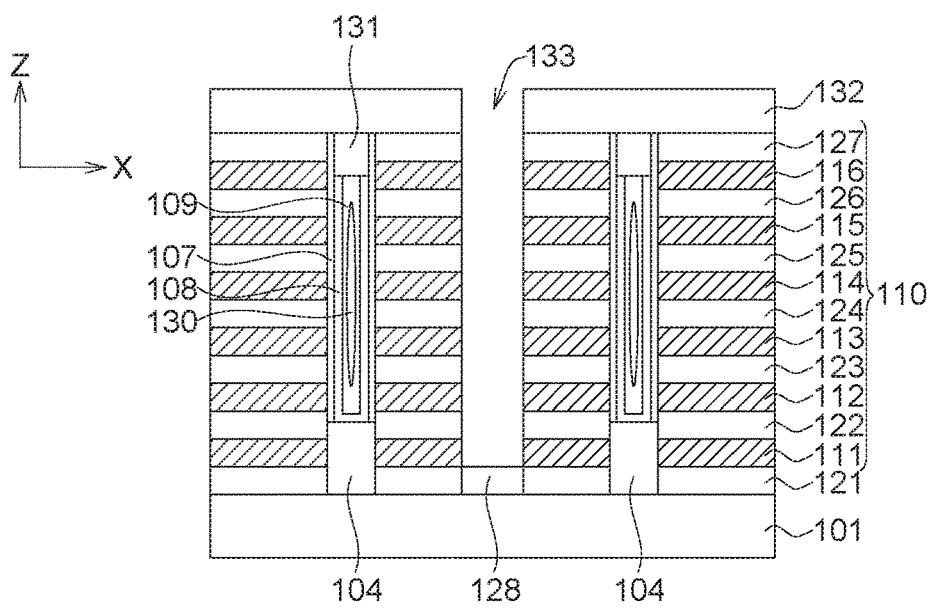
Figure 9:
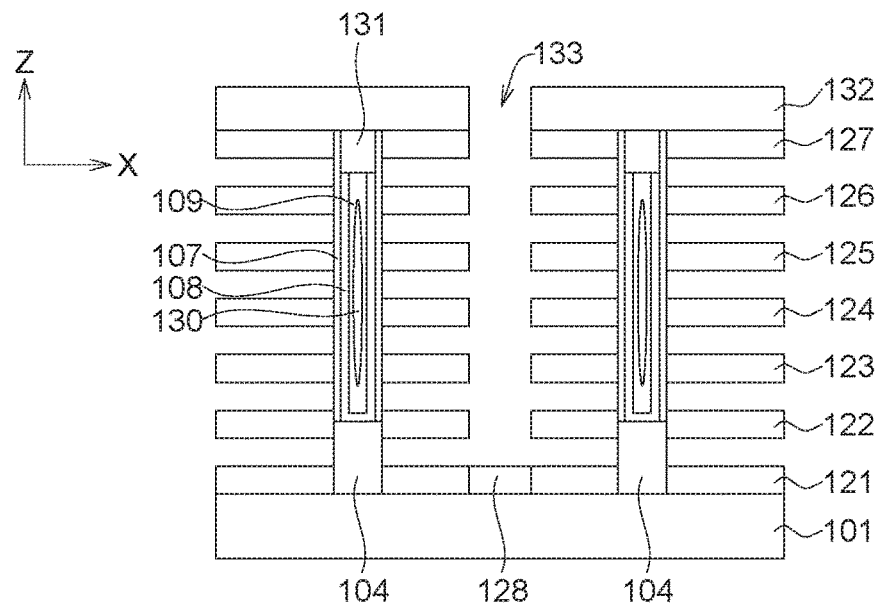

Thereafter, a protection layer 128 is formed on the exposed surface 101a of the semiconductor substrate 101 (see FIG. 8). The protection layer 128 can be formed by an oxidation process to the semiconductor substrate 101. In the present embodiment, the protection layer 128 is a silicon oxide hard mask made by an oxidation process performed on the exposed surface 101a and used to protect the semiconductor substrate 101 in the following process steps. Since the insulating layers 121-127 and sacrificing layers 111-116 are oxide and nitride, they will not be oxidized during protection layer 128 oxidation.

The remaining sacrificing layers 111-116 are then removed. That is, all of the sacrificing layers 111-116 are removed. In the present embodiment, phosphoric acid ($H_3PO_4$) solution is utilized to remove the remaining sacrificing layers 111-116 through the second through opening 133, so as to expose the portions of the memory layer 107 (see FIG. 9).

Figure 10A:
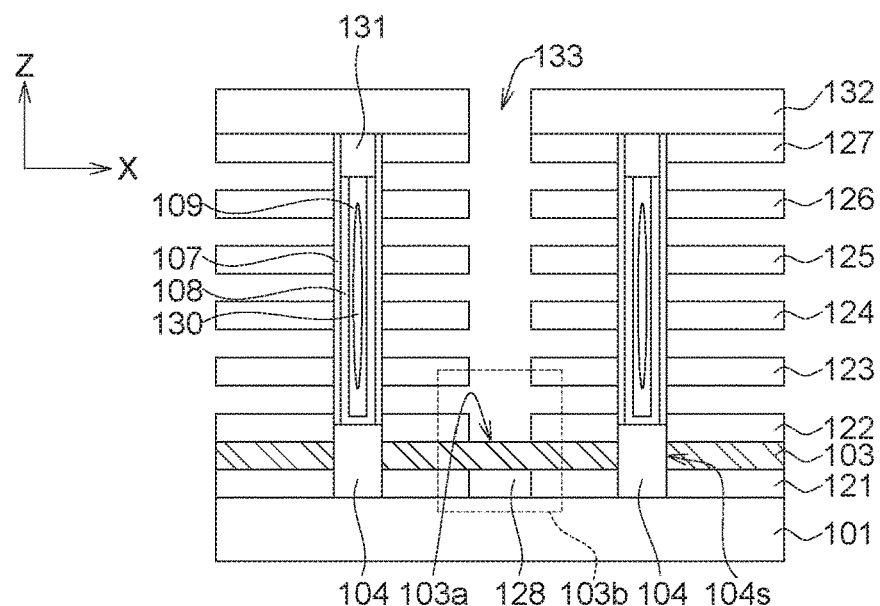
Figure 10B:
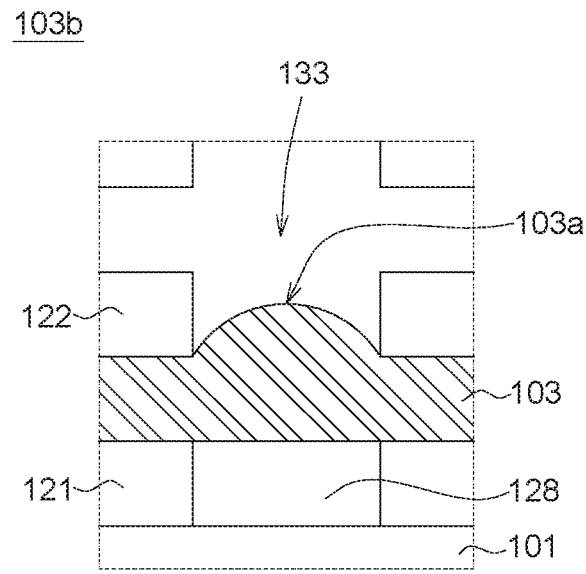
Figure 10C:
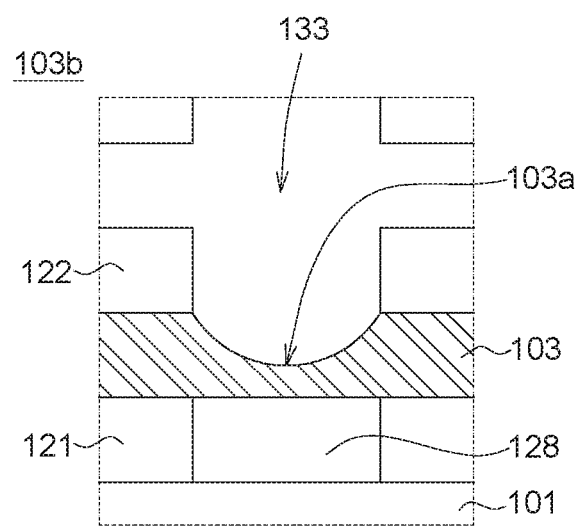
Figure 11:
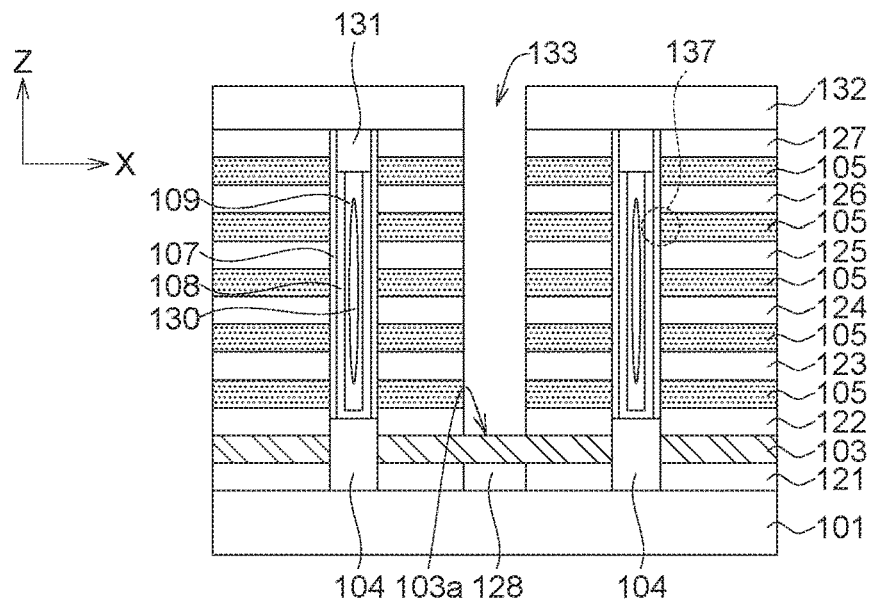

Subsequently, a first conductive layer 103 is formed on the position where the sacrificing layer 111 initially occupied (see FIG. 10A). The first conductive layer 103 can be a SEG layer, that is a monocrystalline silicon layer or a poly-silicon layer formed by a SEG process, and can be a heavily doped layer, such as N+ doped monocrystalline silicon or poly-silicon layers formed by a SEG process. Preferably, the first conductive layer 103 can be the monocrystalline silicon layer formed by a SEG process for its lower resistance than that of the poly-silicon layers formed by a SEG process. The SEG of the first conductive layer 103 is on a portion of a lateral surface 104s of the contact plug 104, and the SEG layer from one contact plug 104 can merge with the SEG layer from another contact plug 104 at the bottom of the second through opening 133 and on the protection layer 128. As a result, a top surface 103a exposed from the second through opening 133 can have a curved shape (see FIGS. 10B and 10C). That is, as shown in an enlarge diagram 103b in FIG. 10B, the first conductive layer 103 in the second through opening 133 can have a middle portion thicker than a side portion connecting to a sidewall of the second through opening 133. Or, as shown in an enlarge diagram 103b in FIG. 10C, the first conductive layer 103 in the second through opening 133 can have a middle portion thinner than a side portion connecting to the sidewall of the second through opening 133.

The first conductive layer 103 and the semiconductor substrate 101 corresponding to the second through opening 133 are separated by the protection layer 128. The protection layer 128 has an upper surface contacting the first conductive layer 103 and a lower surface contacting the semiconductor substrate 101. Since the semiconductor substrate 101 is protected by the protection layer 128 during forming the first conductive layer 103 by the SEG process, no growth of epitaxial silicon is occurred on the semiconductor substrate 101.

Since the first conductive layer 103 of the present application is a SEG layer, that is, a monocrystalline silicon layer or a poly-silicon layer formed by SEG process, the first conductive layer 103 of the present application has a lower resistance than a first conductive layer of a comparative example which is made of poly-silicon layer not formed by SEG. That is, the conductivity of the first conductive layer 103 of the present application is better than that of the first conductive layer of a comparative example which is made of poly-silicon layer not formed by SEG. Thus, the operation speed, such as read or program, of the memory device 100 of the present disclosure can be faster than the comparative example which has the first conductive layer made of poly-silicon not formed by SEG.

Further, since the first conductive layer 103 of the present application is formed after forming the memory layer 107, the process of forming the memory layer 107, such as a thermal oxidation process, may not affect the first conductive layer 103. Therefore, the first conductive layer 103 of the present application may have bet electrical and structural characteristics than a comparative example having a first conductive layer which is formed before the forming of the memory layer.

Additionally, since the first conductive layer 103 of the present application is formed after the forming of the contact plug 104, there is no poly-silicon interface formed by the first conductive layer during the forming of the contact plug 104 to affect the growth of epitaxial silicon. Accordingly, the contact plug 104 of the present disclosure is easier to be grown from the semiconductor substrate 101 comparing to the growth of the contact plug of a comparative example having a poly-silicon interface formed by a first conductive layer which is formed before the forming of the contact plug.

Next, a plurality of second conductive layers 105 are formed on the positions where the remaining sacrificing layers 111-116 initially occupied. As a result, a plurality of memory cells 137 can be defined at the points of intersection between the second conductive layers 105, the memory layer 107 and the channel layer 108, so as to form a memory cell array in the multilayers stack 110 (see FIG. 11). In some embodiments of the present invention, the second conductive layers 105 may be made by poly-silicon, metal or other suitable conductive material and high k material. In the present embodiment, the second conductive layers 105 are made of metal layers, such as TiN/W, TaN/W, TaN/Cu and so on, and the high k material layers, such as $Al_2O_3$, $HfO_2$, $ZrO_2$ and so on.

Figure 12:
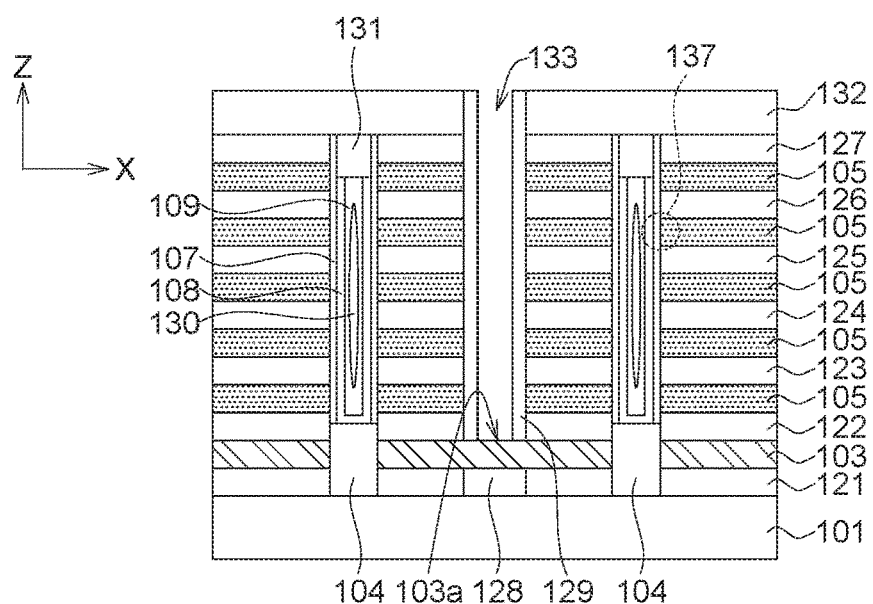

After the forming of the second conductive layers 105, a dielectric spacer 129 is then formed on the sidewalls of the second through opening 133 (see FIG. 12).

Figure 13:
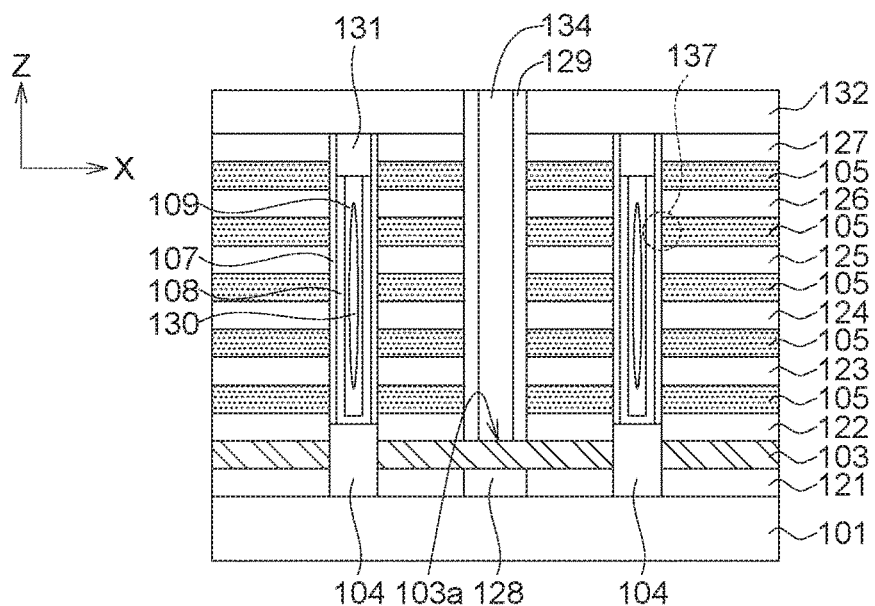

Then, a metal plug 134 is formed in the second through opening 133, whereby the metal plug 134 electrically contacts to the first conductive layer 103 and electrically insulated from the second conductive layers 105 by the dielectric spacer 129 (see FIG. 13).

Figure 14:
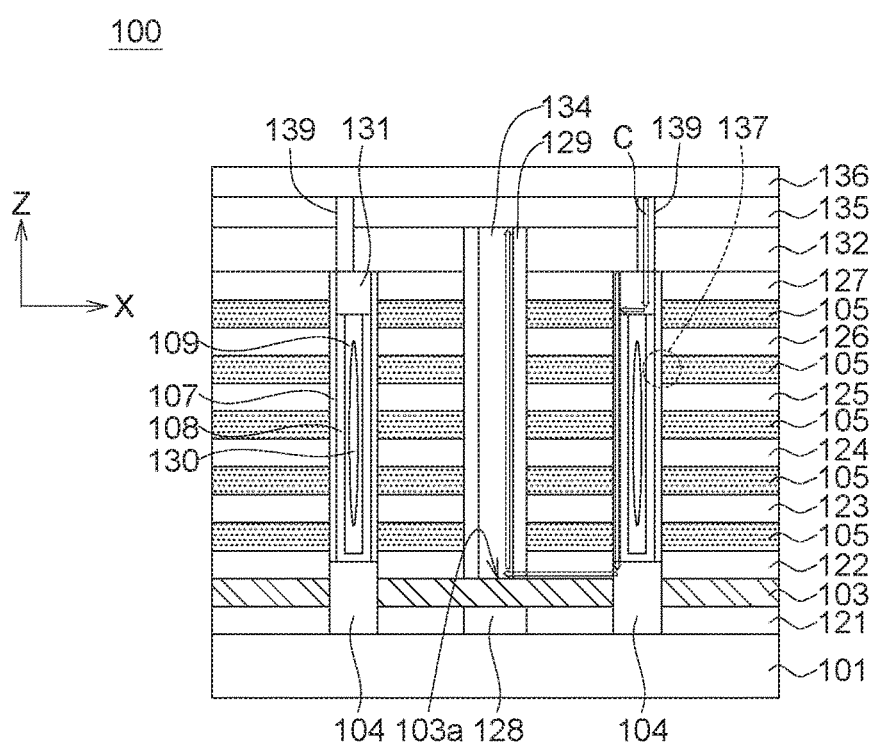

An inter-layer dielectric (ILD) 135 is then formed on the capping layer 132; a plurality of bit lines 136 are electrically connected to the bond pad 131 with an interconnection via 139 which are formed on the ILD 135. Subsequently, after a series of BEOL processes (not shown) are carried out, the memory device 100 as shown in FIG. 14 can be accomplished. In some embodiments of the present invention, the first conductive layer 103 can serve as the bottom common source line of the memory device 100; and the memory cells 137 defined by the second conductive layers 105, the memory layer 107 and the channel layer 108 of the memory cell array can be electrically coupled to a decoder, such as a row decoder or a column decoder (not shown), through the bit lines 136.

The current C coming from the bit lines 136 can flow to the earth by passing through the channel layer 108, the contact plug 104, the first conductive layer 103 (serving as the bottom common source line) and the metal plug 134. In other words, the current path C for performing the read/program operation does not flow through the semiconductor substrate 101. The current path C for performing the read/program operation can be shorter than that of the prior art memory device, the operation resistance and power consumption of the memory device 100 can be reduced. Further, since there is no doped region with p-n junction and parasitic junction capacitance formed between the first conductive layer 103 and the semiconductor substrate 101, thus the problems of signal interference due to the parasitic junction capacitance formed in the bottom common source line and the substrate can be avoided, and the operation reliability and device speed of the memory device can be improved. In addition, since the first conductive layer 103 of the present application is a SEG layer, the first conductive layer 103 of the present application has a lower resistance than a first conductive layer of a comparative example which is a poly-silicon layer not formed by SEG, and the conductivity of the first conductive layer 103 of the present application is better than that of the first conductive layer of a comparative example which is made of poly-silicon layer not formed by SEG.

In accordance with the aforementioned embodiments of the present invention, a memory device and method for fabricating the same are provided, wherein a multilayers stack having a plurality of memory cells defined therein are formed on a semiconductor substrate; at least one contact plug passing through the multilayers stack is formed to electrically contact the semiconductor substrate with a first conductive layer which is a SEG layer in the multilayers stack; and a plurality of channel layers vertically passing through the multilayers stack and electrically in contact with the corresponding contact plugs are then provided to electrically connect the memory cells to form a plurality of memory cell strings. Wherein the distance between the conductive layer and the channel layer is substantially shorter than the distance between the semiconductor substrate and the channel layer.

Because the memory device provided by the embodiments of the present invention applies the independent conductive layer to serve as the bottom common source line, instead of using the semiconductor substrate to serve as the bottom common source line, as the prior art memory device does. The path of current for performing the read/program operation of the present memory device passing through the conductive layer is shorter than that of the prior art memory device passing through the semiconductor substrate, the operation resistance of the present memory device can be thus significantly reduced. Besides, since there is no doped region with different conductivities formed between the conductive layer and the semiconductor substrate of the present memory device, thus the problems of signal interference due to the parasitic junction capacitance formed in the bottom common source line and substrate can be avoided, and the operation reliability and device speed of the memory device can be improved. Additionally, since the first conductive layer of the present disclosure is a SEG layer, the SEG layer served as the bottom common source line has a lower resistance than a poly-silicon layer served as the bottom common source line in the prior art, the electrical conductivity of the first conductive layer of the present application is better.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a semiconductor substrate;
   a bottom insulating layer, disposed on the semiconductor substrate;
   a first conductive layer, disposed on the bottom insulating layer, wherein the first conductive layer is a selective epitaxial growth layer;
   a plurality of insulating layers, disposed over the first conductive layer;
   a plurality of second conductive layers, insulated from the first conductive layer, wherein the second conductive layers and the insulating layers are alternatively stacked;
   a contact plug, passing through the bottom insulating layer and electrically contacting the semiconductor substrate with the first conductive layer;
   a channel layer, disposed on at least one sidewall of at least one first through opening and electrically contact the contact plug, wherein the first through opening passes through the insulating layers, the second conductive layers, so as to expose the contact plug; and a memory layer, disposed between the channel layer and the second conductive layers.

2. The memory device according to claim 1, wherein the first conductive layer has a top surface having a curved shape which is exposed from a second through opening, wherein the second through opening passes through the insulating layers and the second conductive layers.

3. The memory device according to claim 1, further comprising a protection layer disposed on an exposed surface of the semiconductor substrate which is exposed from an second through opening, wherein the second through opening passes through the insulating layers and the second conductive layers, and the protection layer is disposed between the semiconductor substrate and the first conductive layer.

4. The memory device according to claim 3, wherein the protection layer has an upper surface contacting the first conductive layer, and has a lower surface contacting the semiconductor substrate.

5. The memory device according to claim 1, wherein the memory layer comprises an oxide-nitride-oxide (ONO) structure disposed on the sidewall of the first through opening and between the second conductive layers and the channel layer.

6. The memory device according to claim 1, further comprising:
- a dielectric spacer disposed on a sidewall of a second through opening, wherein the second through opening passes through the insulating layers and the second conductive layers, so as to expose the first conductive layer; and
- a metal plug, disposed in the second through opening, electrically in contact with the first conductive layer and electrically insulated from the second conductive layers by the dielectric spacer.

7. The memory device according to claim 1, wherein the contact plug has a top surface higher than a top surface of the first conductive layer.

8. The memory device according to claim 1, further comprising:
- a dielectric material filled into the first through opening in which at least one air gap is formed;
- a bond pad disposed on the dielectric material; and
- a capping layer covering the bond pad.

\* \* \* \* \*